US012148720B2

(12) United States Patent
Zhao et al.

(10) Patent No.: US 12,148,720 B2
(45) Date of Patent: Nov. 19, 2024

(54) DETECTION SUBSTRATE AND MANUFACTURING METHOD THEREOF, FLAT PANEL DETECTOR AND MANUFACTURING METHOD THEREOF

(71) Applicants: Beijing BOE Sensor Technology Co., Ltd., Beijing (CN); BOE TECHNOLOGY GROUP CO., LTD., Beijing (CN)

(72) Inventors: Bin Zhao, Beijing (CN); Shuai Xu, Beijing (CN); Binbin Xu, Beijing (CN); Xuecheng Hou, Beijing (CN); Jinyu Li, Beijing (CN); Ye Zhang, Beijing (CN); Chuncheng Che, Beijing (CN)

(73) Assignees: Beijing BOE Sensor Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/631,441

(22) PCT Filed: Mar. 24, 2021

(86) PCT No.: PCT/CN2021/082784
§ 371 (c)(1),
(2) Date: Sep. 29, 2022

(87) PCT Pub. No.: WO2022/198511
PCT Pub. Date: Sep. 29, 2022

(65) Prior Publication Data
US 2023/0378100 A1 Nov. 23, 2023

(51) Int. Cl.
H01L 27/12 (2006.01)
G01T 1/24 (2006.01)
(Continued)

(52) U.S. Cl.
CPC ............ H01L 23/60 (2013.01); G01T 1/24 (2013.01); G09G 3/00 (2013.01); H01L 21/67 (2013.01);
(Continued)

(58) Field of Classification Search
CPC .. G01T 1/24; G09G 3/00; H01L 21/67; H01L 23/60; H01L 27/0288; H01L 27/124; H01L 27/14663; H01L 27/14689
See application file for complete search history.

(56) References Cited

U.S. PATENT DOCUMENTS 10,186,464 B2 1/2019 Wu
2018/0294199 A1 10/2018 Wu

FOREIGN PATENT DOCUMENTS

CN 105632958 A 6/2016
CN 108565278 A 9/2018
(Continued)

Primary Examiner — Mark R Gaworecki
(74) Attorney, Agent, or Firm — Arch & Lake LLP; Zhangyuan Ji

(57) ABSTRACT

A detection substrate and manufacturing method thereof, a flat panel detector and manufacturing method thereof. The detection substrate includes: a substrate including a detection region, a binding region, a controllable on-off region, and a cutting region; a plurality of detection units including transistors and photosensitive devices located in the detection region, a transistor includes a gate, a first electrode and a second electrode; a photosensitive device is connected to the first or second electrode; a plurality of conductive wires, one end is connected to the gate, and the other end is extended to the binding region; a conductive ring disposed in the cutting region; a plurality of detection wires, one end is connected to the conductive ring, the other end is connected to the conductive wires, the detection wires are passed through the controllable on-off region; the detection (Continued)

wires located in the controllable on-off region can have a disconnected state.

20 Claims, 6 Drawing Sheets

(51) Int. Cl.
*G09G 3/00* (2006.01)
*H01L 21/67* (2006.01)
*H01L 23/60* (2006.01)
*H01L 27/02* (2006.01)
*H01L 27/146* (2006.01)

(52) U.S. Cl.
CPC ........ *H01L 27/0288* (2013.01); *H01L 27/124* (2013.01); *H01L 27/14663* (2013.01); *H01L 27/14689* (2013.01)

(56) References Cited

FOREIGN PATENT DOCUMENTS

| CN | 109521584 | A | | 3/2019 | |
|---|---|---|---|---|---|
| CN | 110890410 | A | | 3/2020 | |
| CN | 110910804 | A | | 3/2020 | |
| CN | 111211113 | A | | 5/2020 | |
| CN | 111900174 | A | * | 11/2020 | ....... G02F 1/136286 |
| WO | 2003008933 | A2 | | 1/2003 | |

* cited by examiner

DETECTION SUBSTRATE AND MANUFACTURING METHOD THEREOF, FLAT PANEL DETECTOR AND MANUFACTURING METHOD THEREOF

CROSS-REFERENCE TO RELATED APPLICATIONS

This application is based upon and claims priority to International Application No. PCT/CN2021/082784, filed on Mar. 24, 2021, the entire contents thereof are incorporated herein by reference.

TECHNICAL FIELD

The present disclosure relates to the field of photoelectric detection technology, in particular to a detection substrate, a manufacturing method of a detection substrate, a flat panel detector, and a manufacturing method of a flat panel detector.

BACKGROUND

X-ray detection is widely used in medical, safety, non-destructive testing, scientific research and other fields; take the application of X-ray detection in the medical field as an example, with the development of medical care, the positive development of the entire society is driven, and the advancement of medical imaging enables clinicians to make more precise judgments when diagnosing different diseases and treatments. The application range of X-ray flat panel detectors covers detection of thoracic cavity, limb joints, and breast, etc., and has been widely used. However, the current flat panel detector still has the problem of introducing ESD (Electro-Static Discharge) in the manufacturing process.

SUMMARY

According to a first aspect of the present disclosure, a detection substrate is provided, and the detection substrate including:
a substrate, including a detection region, a binding region, a controllable on-off region, and a cutting region;
a plurality of detection units, disposed on the substrate, the detection units include transistors and photosensitive devices located in the detection region, a transistor includes a gate, a first electrode and a second electrode; a photosensitive device is connected to the first electrode or the second electrode of the transistor;
a plurality of conductive wires, disposed on the substrate, one end of the plurality of conductive wires is connected to the gate of each of the transistors of the plurality of detection units in a one-to-one correspondence, and the other end is configured to extend to the binding region;
a conductive ring, disposed in the cutting region of the substrate;
a plurality of detection wires, disposed on the substrate, one end thereof is connected to the conductive ring, and the other end is connected to the plurality of conductive wires in a one-to-one correspondence, and the detection wires are configured to pass through the controllable on-off region;
where, the detection wires located in the controllable on-off region is able to have a disconnected state.
In an exemplary embodiment of the present disclosure, the detection wires located in the controllable on-off region are provided with cutting openings, and the cutting openings make the detection wires in the disconnected state.
In an exemplary embodiment of the present disclosure, the detection wires located in the controllable on-off region is provided with tip discharge portions, and the tip discharge portions are able to be fused by a tip discharge to make the detection wires in the disconnected state.
In an exemplary embodiment of the present disclosure, the controllable on-off region is located between the binding region and the cutting region; an etching hole is formed on the controllable on-off region, and the etching hole is cut off the plurality of detection wires, so that the cutting openings are formed on the detection wires.
In an exemplary embodiment of the present disclosure, the detection units include the following layers which are formed in the controllable on-off region:
a wiring layer which includes the plurality of detection wires;
a gate insulating layer which is disposed on a side of the wiring layer away from the substrate;
a first passivation layer which is disposed on a side of the gate insulating layer away from the substrate;
a second passivation layer which is disposed on a side of the first passivation layer away from the substrate;
the etching hole formed in the controllable on-off region is configured to penetrate the second passivation layer, the first passivation layer, the gate insulating layer and the wiring layer.
In an exemplary embodiment of the present disclosure, the plurality of conductive wires and the plurality of detection wires are disposed in a same layer.
In an exemplary embodiment of the present disclosure, the controllable on-off region is located between the binding region and the cutting region; the plurality of conductive wires are extended to the controllable on-off region, a side of the plurality of conductive wires away from the substrate is formed with an insulating layer, and the plurality of detection wires are formed on a side of the insulating layer away from the substrate;
where, a plurality of first via holes and a plurality of second via holes are formed on the insulating layer, orthographic projections of the first via holes on the substrate are located in the controllable on-off region, and orthographic projections of the second via holes on the substrate are located in the binding region; each of the conductive wires is simultaneously exposed through the first via holes and the second via holes; an area of the orthographic projections of the first via holes on the substrate is smaller than an area of the orthographic projections of the second via holes on the substrate; the plurality of detection wires are connected to the plurality of conductive wires in a one-to-one correspondence through the first via holes; the detection wires are configured to form the tip discharge portions in the first via holes.
In an exemplary embodiment of the present disclosure, a width of a first via hole is in a range of 1 µm-2 µm.
In an exemplary embodiment of the present disclosure, a depth of a first via hole is in a range of 0.2 µm-1 µm.
In an exemplary embodiment of the present disclosure, an angle between a sidewall of a first via hole and the substrate is less than 90°.
In an exemplary embodiment of the present disclosure, a plurality of first conductive portions are formed on a side of the insulating layer away from the substrate, and the plurality of first conductive portions are connected to the conductive wires in a one-to-one correspondence through the first via holes, the plurality of first conductive portions are formed the plurality of detection wires.

In an exemplary embodiment of the present disclosure, a plurality of second conductive portions are formed on the side of the insulating layer away from the substrate, and the plurality of second conductive portions are connected to the conductive wires in a one-to-one correspondence through the second via holes.

In an exemplary embodiment of the present disclosure, the plurality of first conductive portions and the plurality of second conductive portions are disposed in a same layer.

In an exemplary embodiment of the present disclosure, each of the conductive wires is exposed through the plurality of the first via holes.

According to a second aspect of the present disclosure, a manufacturing method of a detection substrate is provided, including:
- providing a substrate, including a detection region, a binding region, a controllable on-off region and a cutting region;
- forming a plurality of detection units on the substrate, wherein the detection units include transistors and photosensitive devices located in the detection region, a transistor includes a gate, a first electrode and a second electrode; the photosensitive device is connected to the first electrode or the second electrode of the transistor;
- forming a plurality of conductive wires on the substrate, one end of each of the plurality of conductive wires is connected to the gate of each of the transistors in the plurality of detection units in a one-to-one correspondence, and the other end is extended to the binding region;
- forming a conductive ring in the cutting region of the substrate;
- forming a plurality of detection wires on the substrate, wherein one end of the plurality of detection wires is connected to the conductive ring, and the other end is connected to the plurality of conductive wires in a one-to-one correspondence, and the detection wires are configured to pass through the controllable on-off region; the detection wires located in the controllable on-off region are able to have a disconnected state.

In an exemplary embodiment of the present disclosure, cutting openings are formed on the detection wires located in the controllable on-off region, and the detection wires are in a disconnected state through the cutting openings.

In an exemplary embodiment of the present disclosure, tip discharge portions are formed on the detection wires located in the controllable on-off region, and the detection wires are disconnected by the tip discharge portions.

According to a third aspect of the present disclosure, a manufacturing method of a flat panel detector is provided, including:
- a manufacturing method of a detection substrate provided in any one of the embodiments described above;
- removing a cutting region on the detection substrate.

According to a fourth aspect of the present disclosure, a flat panel detector is provided, the flat panel detector is formed by the manufacturing method of a flat panel detector described above.

It should be understood that the above general description and the following detailed description are only exemplary and explanatory, and cannot limit the present disclosure.

BRIEF DESCRIPTION OF THE DRAWINGS

The accompanying drawings herein are incorporated into the specification and form a part of the present specification. The embodiments conforming to the present disclosure are shown and used to explain the principles of the present disclosure in conjunction with the specification. Obviously, the accompanying drawings described below are only some embodiments of the present disclosure, and other drawings can be obtained from these accompanying drawings without any creative effort for those skilled in the art.

DETAILED DESCRIPTION

Figure 1:
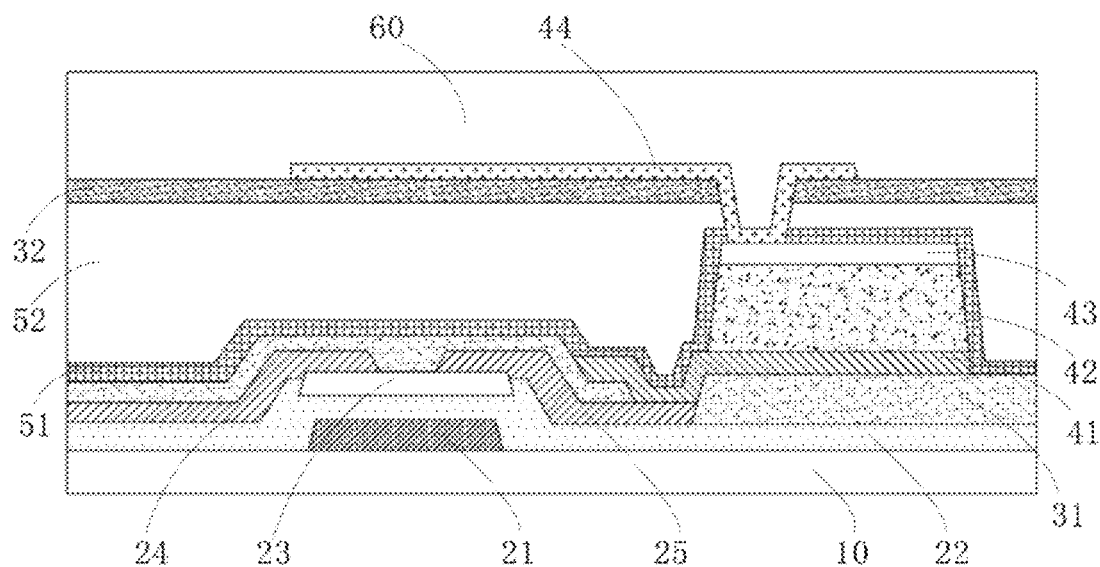
FIG. 1 is a schematic structural diagram of a detection substrate of an embodiment of the present disclosure.

In the following, the technical solutions of the present disclosure will be further described in detail through the embodiments and in conjunction with the accompanying drawings. In the specification, the same or similar reference numerals indicate the same or similar components. The following description of the embodiments of the present disclosure with reference to the accompanying drawings is intended to explain the general inventive concept of the present disclosure, and should not be construed as a limitation to the present disclosure.

In addition, in the following detailed description, for the convenience of explanation, many specific details are set forth to provide a comprehensive understanding of the embodiments of the present disclosure. However, it is obvious that one or more embodiments can also be implemented without these specific details.

The static electricity generated by the human body is caused by the transfer of electrons in the outer layer of atoms under the influence of various external forces to form positive and negative ions. When any two objects of different materials come into contact, the transfer and accumulation of electric charge will occur, forming static electricity. The static electricity on the human body is mainly caused by the friction between clothes or between clothes and the body. Therefore, the amount of "charged" when wearing clothes of different materials is different, for example, clothes made of chemical fibers are more likely to generate static electricity, while clothes made of cotton produce less. And because the dry environment is more conducive to the transfer and accumulation of electric charge, people will feel that the static electricity on the body is relatively large in winter. Under different humidity conditions, the electrostatic potential generated by human activities is different. In the dry season, the human body's static electricity can reach thousands of volts or even tens of thousands of volts. Experiments have proved that there is no discomfort to the human body when the electrostatic voltage is 50,000 volts, and there is no danger to life when the electrostatic voltage is 120,000 volts. However, such high static electricity can cause great harm to electronic devices.

The detection trace(s) (AT trace) of the traditional FPXD (flat panel X-ray detector) is made from a whole piece of metal in the manufacturing process, and the static electricity is extremely easy to conduct from the cross section to the inside of the FPXD. Metal traces have good conductivity, and static electricity is not easy to release at the traces. Therefore, damage points of ESD are mostly located at the internal device structure of FXPD products, causing device function failure.

Specifically, after the cutting of the array substrate is completed, there is a metal cross section of an AT trace at the edge of the array substrate. When picking and placing the array substrate, human hands can easily touch the metal cross section of the trace and conduct the static electricity carried into the array substrate, causing the device to be statically burned, resting in poor trace, and invalidating the array substrate.

Figure 12:
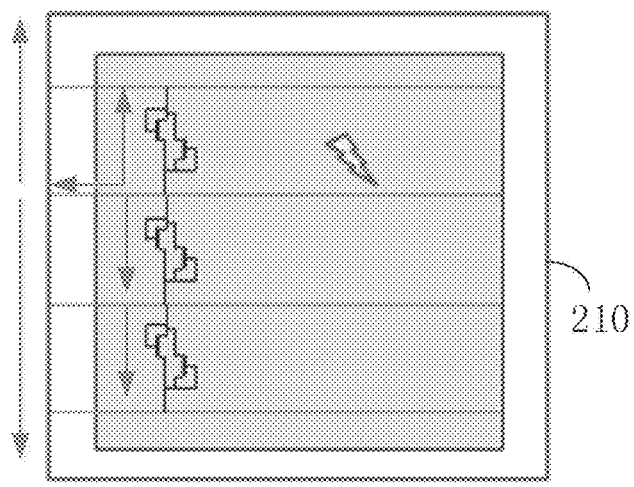
FIG. 12 is a schematic diagram of electrostatic discharge before the detection wires are removed in the related art.
Figure 13:
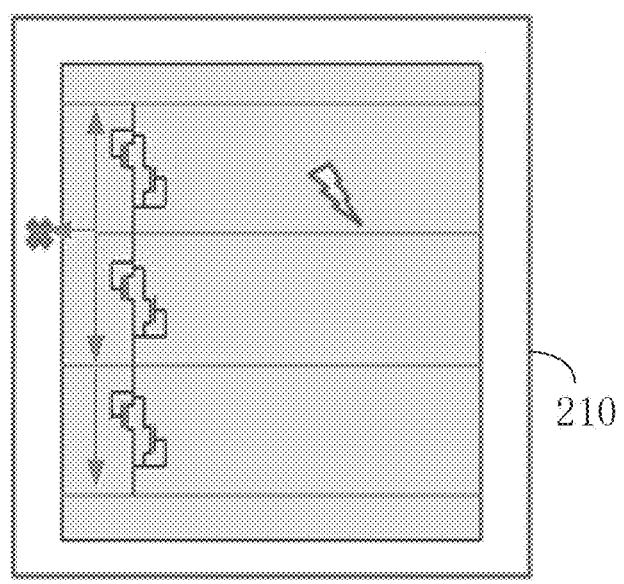
FIG. 13 is a schematic diagram of electrostatic discharge after the detection wires are removed in the related art.

In the related art, as shown in FIG. 12 and FIG. 13, in order to solve the failure caused by static electricity generated by touch, a more effective method is to remove the AT trace. After removal, there is no leakage of metal traces at the edge of the array substrate, which reduces the risk of people accidentally touching the metal traces and introducing static electricity.

After the AT trace is removed, the distance from the metal trace to the edge of the array substrate increases, it is not easy for personnel to touch the metal traces when picking and placing the array substrate, which reduces the incidence rate of ESD in the later stage. However, dark lines are found to be defective when testing on the client and on the whole machine, this phenomenon is very slight, and the CT equipment used in the production line cannot be effectively detected, and can only be observed after Bonding ROIC, which has a greater impact on the company's shipments. The product with the AT trace removed is found to be defective in the dark lines during the on-line detection of the whole machine, the reason is that the static electricity in the process caused the failure of the electrostatic ring, which results in the dark line defect.

In response to the above technical problems, the inventor confirmed after detailed analysis that the cause of the dark line is related to the removal of the AT trace. After the AT trace is removed, the static electricity cannot be quickly evacuated during the manufacturing process of the array substrate. If a large amount of static electricity is introduced, and the static electricity is introduced locally, the static electricity is only distributed by the electrostatic ring to each wiring, and the speed is slow. When the introduced voltage is large, it is very easy to cause electrostatic damage to the device caused by the untimely discharge of the charge.

Figure 2:
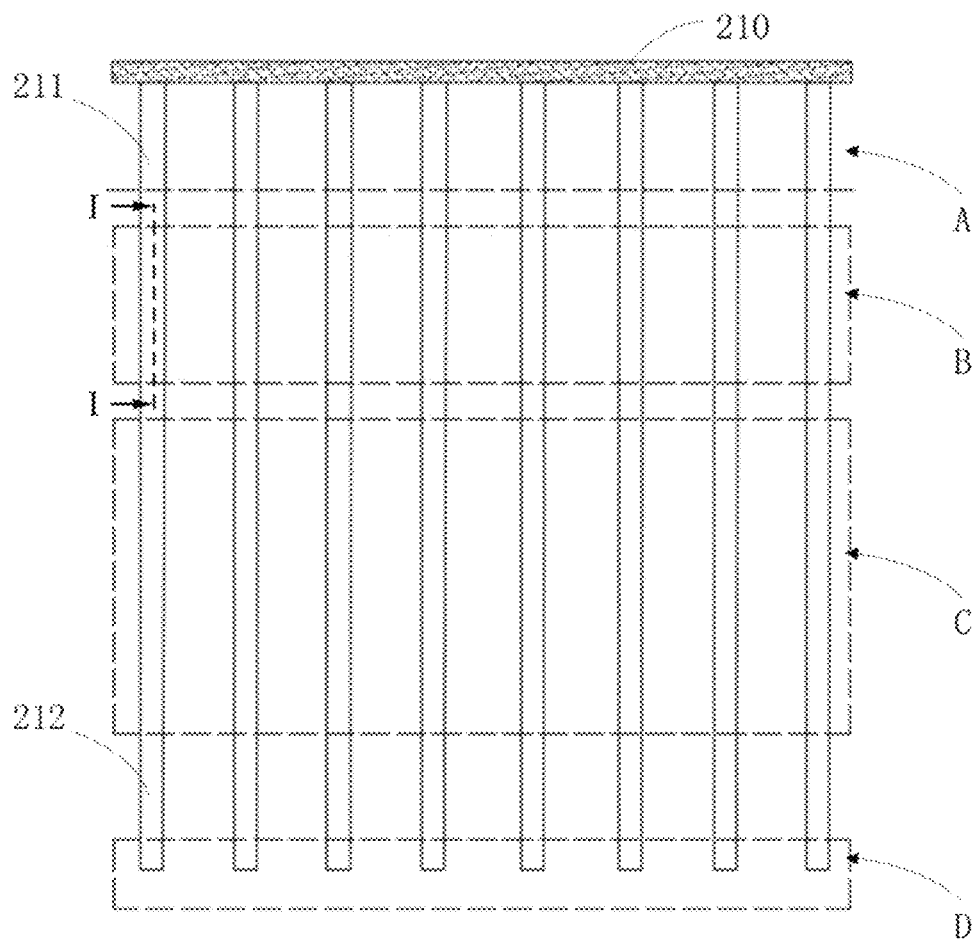
FIG. 2 is a top view of the detection substrate of an embodiment of the present disclosure.
Figure 3:
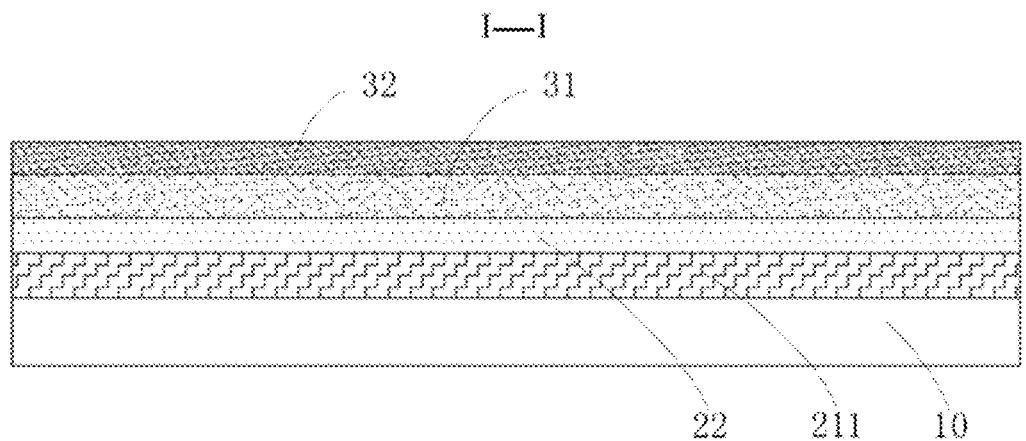
FIGS. 3-6 are the process structure diagrams of forming an etching hole in the controllable on-off region of the detection substrate of an embodiment of the present disclosure, the structure is shown in a cross-sectional view along I-I in FIG. 2.
Figure 4:
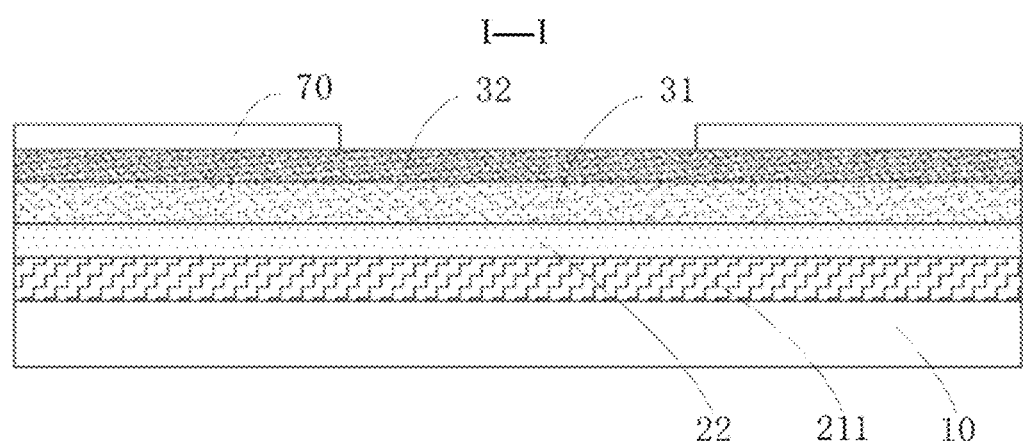
Figure 5:
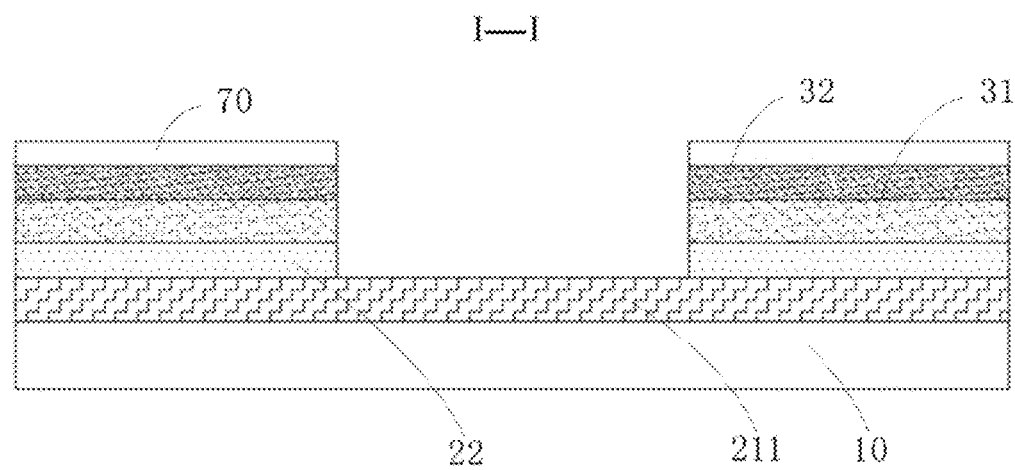
Figure 6:
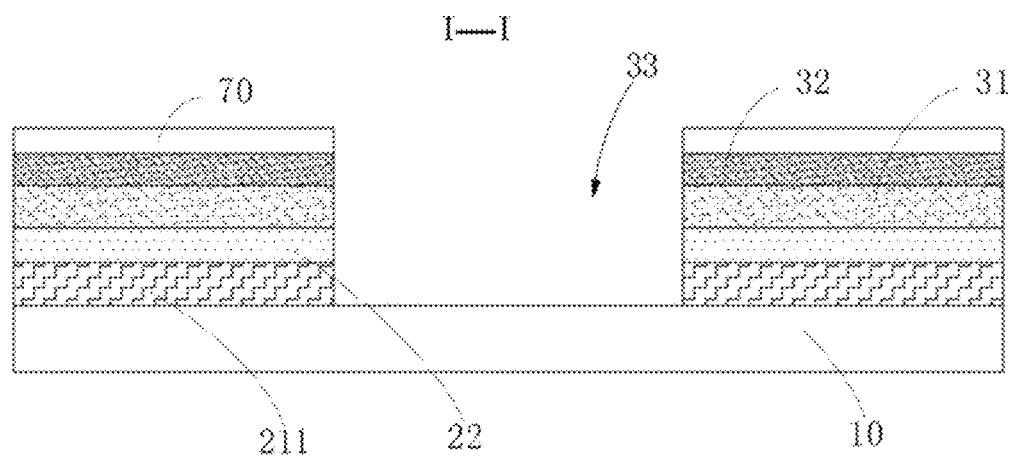

For the above technical problems, the embodiments of the present disclosure first provide a detection substrate, as shown in FIG. 1 and FIG. 2, the detection substrate includes: a substrate 10, a plurality of detection units, a plurality of conductive wires 212, a plurality of detection wires 211, and a conductive ring 210; the substrate 10 includes a detection region D, a binding region C, a controllable on-off region B, and a cutting region A. The plurality of detection units are disposed on the substrate 10, and the detection units include transistors and photosensitive devices located in the detection region D, the transistor includes a gate 21, a first electrode 24 and a second electrode 25; the photosensitive device is connected to the first electrode 24 or the second electrode 25 of the transistor; One end of each of the plurality of conductive wires 212 is connected to the gate 21 of each of the transistors of the plurality of detection units in a one-to-one correspondence, and the other end extends to the binding region C; the conductive ring 210 is disposed in the cutting region A of the substrate 10; a plurality of detection wires 211 are disposed on the substrate 10, one end is connected to the conductive ring 210, and the other end is connected to the plurality of conductive wires 212 in a one-to-one correspondence, and the detection wires 211 pass through the controllable on-off region B; where, the detection wires 211 located on the controllable on-off region B can have a disconnected state.

In the detection substrate provided by the present disclosure, the detection wires 211 in the controllable on-off region B can have a disconnected state, at the end of the manufacturing process, the AT trace is removed to ensure that the AT trace at the edge cannot be connected to the inside of the array substrate in the back-end process, thereby reducing the probability of occurrence of defects caused by static electricity produced by personnel picking and placing operations on the array substrate after the manufacturing process.

In an embodiment of the present disclosure, as shown in FIG. 2, the controllable on-off region B is located between the binding region C and the cutting region A; the plurality of detection wires 211 are configured to pass through the controllable on-off region B and are connected to the plurality of conductive wires 212 in a one-to-one correspondence; the detection wires 211 located in the controllable on-off region B are provided with cutting openings 33, and the cutting openings 33 make the detection wires 211 in a disconnected state.

In the present disclosure, the AT trace is removed after the detection units are formed, that is, when the manufacturing process is about to end. On the one hand, the AT trace is connected to the internal trace of the array substrate during the manufacturing process, when the static electricity is introduced locally in the manufacturing process, the static electricity can be quickly drained to the various traces by the electrostatic ring, thereby quickly draining and apportioning the charges, avoiding the situation that a single device bears a large charge and fails, and ensuring that the static electricity does not damage the device during the manufacturing process, thus playing a role in protecting the device; on the other hand, removing the AT trace at the end of the manufacturing process can also ensure that the AT trace at the edge cannot be connected to the inside of the array substrate in the back-end process, thereby reducing the probability of occurrence of defects caused by static electricity produced by personnel picking and placing operations on the array substrate after manufacturing process.

Specifically, as shown in FIG. 1, the detection unit includes a gate 21 formed on the substrate 10, and a gate insulating layer 22 formed on the substrate 10 and covering the gate 21, an active layer 23 located on a side of the gate insulating layer 22 away from the substrate 10 and a source-drain metal layer (SD layer) located on a side of the active layer 23 away from the substrate 10. The source-drain metal layer includes a first electrode 24 and a second electrode 25, the first electrode 24 and the second electrode 25 are spaced apart on the active layer 23; the gate 21, the gate insulating layer 22, the active layer 23, the first electrode 24 and the second electrode 25 form a transistor. Where, the first electrode 24 is a source electrode and the second electrode 25 is a drain electrode; or the first electrode 24 is a drain electrode and the second electrode 25 is a source electrode.

Exemplary, the material of the substrate 10 may be an inorganic material, such as soda lime glass, quartz glass, sapphire glass and other glass materials, or metal materials of various metals such as stainless steel, aluminum, and nickel or alloys thereof. In other embodiments, the material of the substrate 10 may also be an organic material, such as polymethylmethacrylate (PMMA), polyvinyl alcohol (PVA), polyvinylphenol (PVP), polyethersulfone (PES), polyimide, polyamide, polyacetal, polycarbonate (PC), polyethylene terephthalate (PET), polyethylene naphthalate (PEN), or a combination thereof. In other embodiments, the material of the substrate 10 may also be a flexible material, such as polyimide (PI). The substrate 10 may be a single-layer structure or a multi-layer structure, and the multi-layer structure may be formed of different materials.

Exemplary, the material of the gate 21 may be a conductive material. The conductive material is, for example, a metal, a conductive metal oxide, a conductive polymer, a conductive composite material, or a combination thereof. For example, the metal can be platinum, gold, silver, aluminum, chromium, nickel, copper, molybdenum, titanium, magnesium, calcium, barium, sodium, palladium, iron, manganese, or a combination thereof. The conductive metal oxide may be $InO_2$, $SnO_2$, indium tin oxide (ITO), fluorine-doped tin oxide (FTO), aluminum-doped zinc oxide (AZO), gallium-doped zinc oxide (GZO), or a combination thereof. The conductive polymer may be polyaniline, polypyrrole, polythiophene, polyacetylene, poly(3,4-ethylenedioxythiophene)/polystyrene sulfonic acid (PEDOT/PSS) or a combination thereof. The conductive composite material may be a conductive composite material in which carbon black, graphite powder, metal fine particles, and the like are dispersed. The method for forming the gate 21 is, for example, physical vapor deposition (PVD), chemical vapor deposition (CVD), spin coating, or a combination thereof.

Exemplary, the gate insulating layer 22 may be silicon oxide, silicon oxynitride, silicon nitride, or other suitable insulating materials (for example, organic polymer compounds) or a combination of the foregoing materials. The method for forming the gate insulating layer 22 is, for example, physical vapor deposition, chemical vapor deposition, spin coating, or a combination thereof.

Exemplary, the materials of the first electrode 24 and the second electrode 25 may include metal, conductive oxide, or a combination thereof. For example, the metal may be titanium, platinum, ruthenium, gold, silver, molybdenum, aluminum, tungsten, copper, neodymium, chromium, tantalum or alloys thereof or a combination of the foregoing materials. The conductive oxide may be indium zinc oxide (IZO), aluminum-doped zinc oxide (AZO), indium tin oxide (ITO), zinc gallium oxide (GZO), zinc tin oxide (ZTO), or a combination thereof. The method for forming the first electrode 24 and the second electrode 25 is, for example, PVD, CVD, or a combination thereof. The materials of the first electrode 24 and the second electrode 25 may be the same or different. Using the same material can reduce the process cost and difficulty of forming the first electrode 24 and the second electrode 25.

Exemplary, the material of the active layer 23 may be amorphous silicon, polycrystalline silicon, microcrystalline silicon, single crystal silicon, oxide semiconductor material, organic silicon material, organic oxide semiconductor material, or a combination thereof. The method for forming the active layer 23 is, for example, PVD, CVD, or a combination thereof.

In the embodiments of the present disclosure, the transistor may be a top gate type or a bottom gate type. In the embodiments of the present disclosure, the transistor is mainly of a bottom gate type as an example for description. When the transistor is of the bottom gate type, the gate 21 is formed on the substrate 10, the gate 21 may include metal materials or alloy materials, such as molybdenum, aluminum, titanium, etc., to ensure good electrical conductivity; the gate insulating layer 22 is formed on the substrate 10 and covers the gate 21; the active layer 23 is formed on the side of the gate insulating layer 22 away from the substrate 10, and the first electrode 24 and the second electrode 25 are respectively connected to two doped regions of the active layer 23.

Exemplary, as shown in FIG. 1, the detection unit further includes a first passivation layer 31 formed on the substrate 10, a lower electrode 41 formed on the side of the first passivation layer 31 away from the substrate 10, the lower electrode 41 is electrically connected to the second electrode 25 through the via hole on the first passivation layer 31; a photoelectric layer 42 formed on the side of the lower electrode 41 away from the substrate 10, the photoelectric layer 42 is, for example, a photodiode; and an upper electrode 44 formed on the side of the photoelectric layer 42 away from the substrate 10, the upper electrode 44 is a transparent electrode so that light can enter the photoelectric layer 42. Where, the lower electrode 41, the photoelectric layer 42 and the upper electrode 44 form the photosensitive device. The photosensitive device receives light to generate an electrical signal, which is transmitted to the transistor, and the transistor transmits the signal to the control terminal. Where, a transparent conductive layer 43 can also be formed between the photoelectric layer 42 and the upper electrode 44.

Exemplary, the first passivation layer 31 may use an inorganic insulating film, such as silicon nitride, or the like, or an organic insulating film, such as a resin material, or the like. The lower electrode 41 can be made of metal or metal alloy, such as molybdenum, molybdenum niobium alloy, aluminum, aluminum neodymium alloy, titanium, or copper or other conductive materials. The material of the upper electrode 44 may be Indium Tin Oxides (ITO) or Indium-doped Zinc Oxide (IZO), etc., so as to prevent the upper electrode 44 from blocking light and affecting the collection of light by the photoelectric layer 42.

Where, as shown in FIG. 1, a planarization layer (Resin) is also formed on the substrate 10, a second passivation layer (PVX2) 32 located on the side of the planarization layer away from the substrate 10, a metal wiring layer (Top Metal) located on the side of the second passivation layer 32 away from the substrate 10, a third passivation layer (PVX3) 60 located on the side of the metal wiring layer away from the substrate 10, a transparent conductive layer (Top ITO, not shown in the figure) located on the side of the third passivation layer 60 away from the substrate 10, and other related film layers, depend on specific conditions.

Exemplary, the second passivation layer 32 can be an inorganic insulating film, such as silicon nitride, or an organic insulating film, such as a resin material. The materials of the second passivation layer 32 and the first passivation layer 31 may be the same or different. The metal wiring layer can be made from metal or metal alloy, such as molybdenum, molybdenum niobium alloy, aluminum, aluminum neodymium alloy, titanium, or copper or other conductive materials. The third passivation layer 60 can be an inorganic insulating film, such as silicon nitride, or an organic insulating film, such as a resin material. The materials of the third passivation layer 60, the second passivation layer 32 and the first passivation layer 31 may be the same or different. The transparent conductive layer is made of transparent conductive materials such as indium tin oxide or indium-doped zinc oxide.

Where, the photodiode may be a PIN photodiode, and the PIN photodiode includes a lower electrode 41, an N-type amorphous silicon layer, an intrinsic amorphous silicon layer, a P-type amorphous silicon layer, and an upper electrode 44. Exemplary, the N-type amorphous silicon may be amorphous silicon doped with phosphorus ions, and the P-type amorphous silicon may be amorphous silicon doped with boron ions.

Where, as shown in FIGS. 3-6, a second passivation layer 32, a first passivation layer 31, a gate insulating layer 22 and a wiring layer are formed on the substrate 10 located in the controllable on-off region B. An etching hole penetrating the second passivation layer 32, the first passivation layer 31, the gate insulating layer 22 and the wiring layer is formed in the controllable on-off region B through dry etching processes such as the plasma etching (PE), the reactive ion etching (RIE), the enhanced capacitive coupled plasma etching (ECCP), the inductively coupled plasma etching (ICP), or through etching processes such as spraying and dipping. The etching hole cuts off a plurality of detection wires 211, so that a cutting opening 33 is formed on the detection wire 211. It is ensured that the AT trace at the edge cannot be connected to the inside of the array substrate in the back-end process, thereby reducing the probability of occurrence of defects caused by static electricity produced by personnel picking and placing operations on the array substrate after manufacturing process.

Where, the plurality of conductive wires 212 and the plurality of detection wires 211 are arranged on the same layer, that is, the bot can be made with one patterning process to reduce the cost of the mask; but it is not limited to this, and it can also be made by different patterning processes, depending on the specific situation. The plurality of conductive wires 212 and the plurality of detection wires 211 can be formed through the same conductive material layer and through one patterning process (film formation, exposure, development, wet etching or dry etching), that is, the correspondingly connected conductive wire 212 and the detection wire 211 may be different parts of the same wire.

In an embodiment of the present disclosure, the detection wires 211 located on the controllable on-off region B are provided with tip discharge portions 2111, and the tip discharge portions 2111 can be fused by the tip discharge, so that the detection wires 211 are in a disconnected state.

Figure 7:
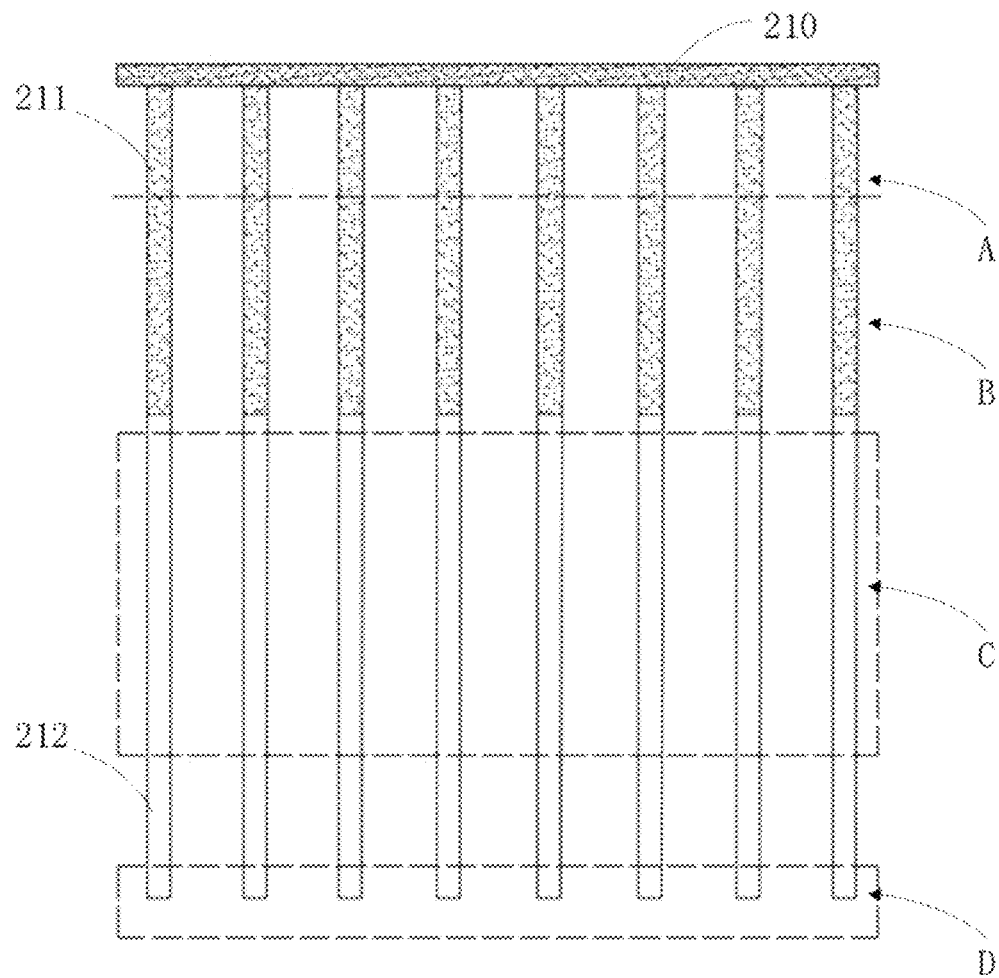
FIG. 7 is a top view of the detection substrate of another embodiment of the present disclosure.
Figure 9:
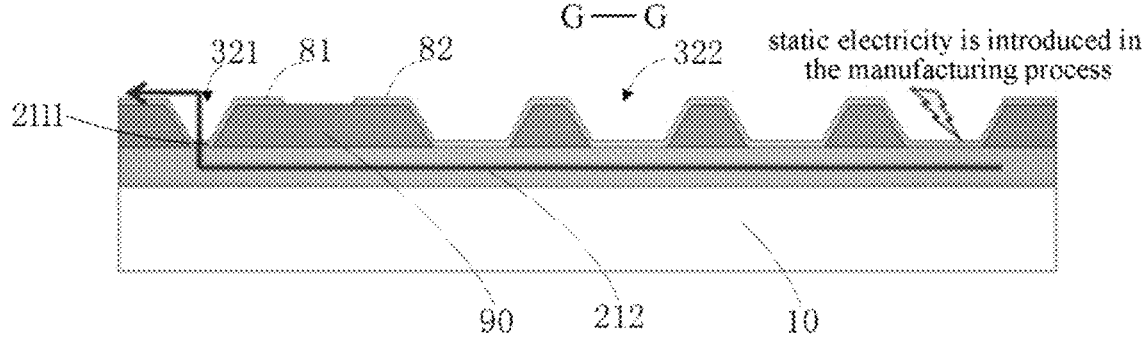
FIG. 9 is a schematic diagram of the introduction of static electricity during the manufacturing process of the detection substrate of an embodiment of the present disclosure, the structure is shown in a cross-sectional view along G-G in FIG. 8.
Figure 10:
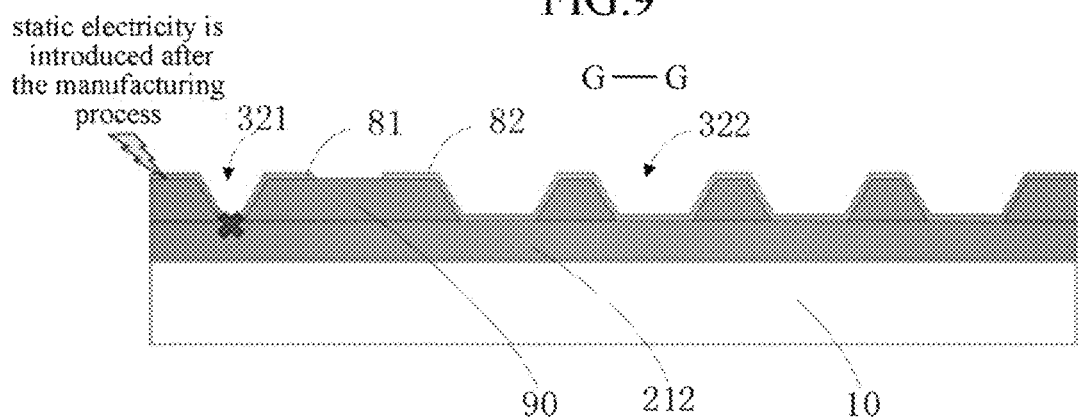
FIG. 10 is a schematic diagram of the introduction of static electricity after the manufacturing process of the detection substrate of an embodiment of the present disclosure, the structure is shown in a cross-sectional view along G-G in FIG. 8.

In an embodiment of the present disclosure, as shown in FIG. 7, the controllable on-off region B is located between the binding region C and the cutting region A; the plurality of conductive wires 212 extend to the controllable on-off region B, the side of the plurality of conductive wires 212 away from the substrate 10 is formed with an insulating layer 90, as shown in FIG. 9 and FIG. 10, the plurality of detection wires 211 are formed on the side of the insulating layer 90 away from the substrate 10.

Figure 8:
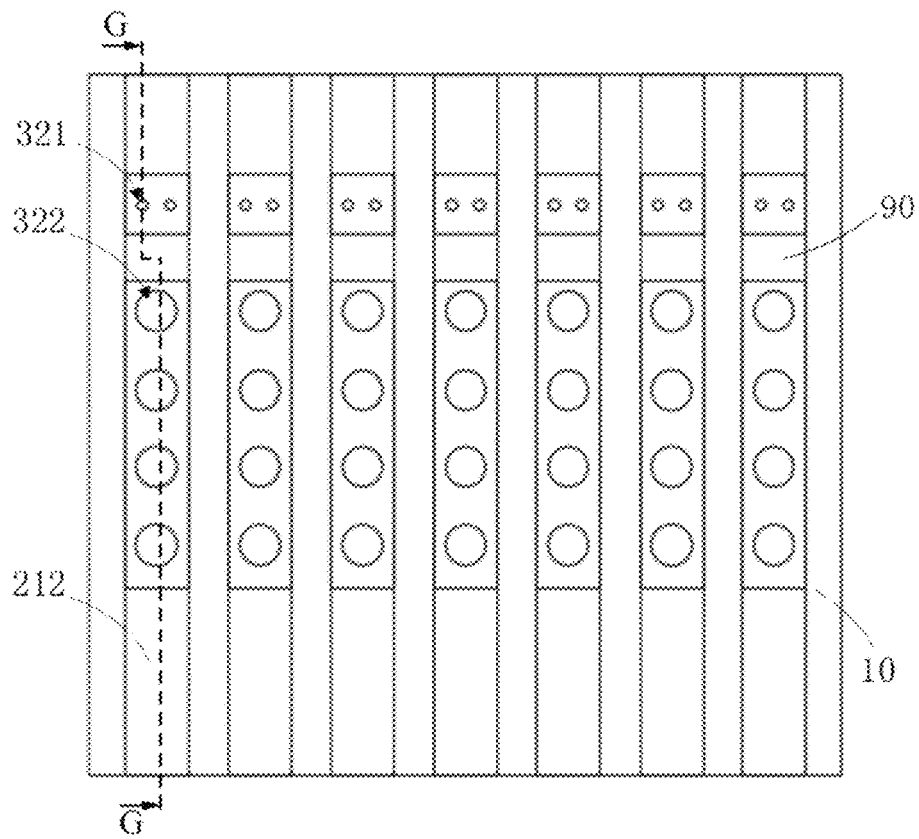
FIG. 8 is a schematic diagram of the first via holes and the second via holes of another embodiment of the present disclosure.

Where, as shown in FIGS. 8-10, a plurality of first via holes 321 and a plurality of second via holes 322 are formed on the insulating layer 90, the orthographic projections of the first via holes 321 on the substrate 10 are located in the controllable on-off region B, and the orthographic projections of the second via holes 322 on the substrate 10 are located in the binding region C; each conductive wire 212 is simultaneously exposed through the first via holes 321 and the second via holes 322; the area of the orthographic projection of the first via hole 321 on the substrate 10 is smaller than the area of the orthographic projection of the second via hole 322 on the substrate 10; the plurality of detection wires 211 are connected to the plurality of conductive wires 212 in a one-to-one correspondence through the first via holes 321; the detection wires 211 form tip discharge portions 2111 in the first via holes 321 (for example, a tip discharge portion 2111 may be formed at a portion where the first via hole 321 is projected on the substrate 10 with the smallest area).

In the manufacturing process, the AT trace is used to dissipate static electricity, and the voltage actually distributed to a single trace is relatively small, which can be conducted through lapping small-size ITO over via holes; after the manufacturing process, when static electricity is introduced by the AT trace, the small-size ITO lapped over via holes cannot conduct excessive voltage and burn out, the static conduction path is cut off and cannot be further conducted into the FTXD to damage the devices and traces. In the present disclosure, by designing different regions to use different sizes of via holes for lapping, it can not only ensured that there are AT traces to connect the traces in most of the manufacturing processes, further achieve ESD protection throughout the manufacturing process and reduce ESD damage to a single device during the manufacturing process, but also ensure that the AT traces at the edge cannot be connected to the inside of the array substrate in the back-end process, in the case that large voltage is introduced due to personnel touch after the manufacturing process, the via holes for lapping are easily burnout, thereby reducing the probability of occurrence of defects caused by static electricity produced by personnel picking and placing operations on the array substrate after manufacturing process, and further avoiding the introduction of static electricity into the FTXD product, which plays a role in protecting the device.

In an embodiment of the present disclosure, as shown in FIGS. 8 and 10, a plurality of first conductive portions 81 are formed on the side of the insulating layer 90 away from the substrate 10, and the plurality of first conductive portions 81 form a plurality of detection wires 211.

Further, a plurality of second conductive portions 82 are formed on the side of the insulating layer 90 away from the substrate 10, and the plurality of second conductive portions 82 are connected to the conductive wires 212 in a one-to-one correspondence through the second via holes 322.

Where, the plurality of first conductive portions 81 and the plurality of second conductive portions 82 are disposed in the same layer, and can be formed by one patterning process.

Exemplary, the cross-sectional shape of the first via hole 321 may be cylindrical, trapezoidal or irregular. The width of the first via hole 321 (the width of the first via hole 321 extending on the plane of the substrate 10, when the first via hole 321 is an unequal diameter via hole or a non-cylindrical via hole, it has multiple width values) can be 1 μm-2 μm, such as 1 μm, 1.2 μm, 1.5 μm, 1.7 μm, 1.8 μm, 2 μm, etc., which are not listed here in the present disclosure. Of course, the diameter of the first via hole 321 can also be less than 1 µm or greater than 2 µm. The present disclosure does not limit this, any tip discharge portion 2111 can be formed to realize the effect that the conductive material in the first via hole 321 can be easily fused when a large voltage is introduced due to a person's touch in the subsequent manufacturing process.

Exemplary, the depth of the first via hole 321 (the depth direction is the direction of the insulating layer 90 away from the substrate 10) is 0.2 µm-1 µm, such as 0.2 µm, 0.3 µm, 0.5 µm, 0.7 µm, 0.8 µm, 1 µm, etc., the present disclosure will not list them all here. Of course, the depth of the first via hole 321 may also be less than 0.2 µm or greater than 1 µm, which is not limited in the present disclosure.

Exemplary, the angle between the sidewall of the first via hole 321 and the substrate 10 is less than 90°. As shown in FIG. 9, the angle between the sidewall of the first via hole 321 and the substrate 10 is less than 90°, the angle is toward the periphery of the substrate 10, for example, the value of the angle is 80°, 70°, 60°, 50°, 40°, 30°, etc., the present disclosure will not list them all here. Of course, when the first via hole 321 is a hole with unequal diameter, the angle between the first via hole 321 and the substrate 10 at different heights is different, or greater than 90°, which is not limited in the present disclosure.

Where, the cross-sectional shape of the second via hole 322 may be cylindrical, trapezoidal or irregular. When the cross-sectional shape of the second via hole 322 may be cylindrical, the diameter of the second via hole 322 may be 6 µm-10 µm, such as 6.0 µm, 6.5 µm, 7.0 µm, 7.5 µm, 8 µm, etc., which are not listed here in the present disclosure. Of course, the diameter of the second via hole 322 may also be less than 6 µm or greater than 10 µm, which is not limited in the present disclosure. The ratio of the diameter of the second via hole 322 to the first via hole 321 may be 5:1, but is not limited to this, and may also be 4:1 or 6:1, depending on the specific situation.

In an embodiment of the present disclosure, each conductive wire 212 is exposed through a plurality of first via holes 321. As shown in FIG. 8, each conductive wire 212 is exposed through two first via holes 321. Since the size of the first via hole 321 is small, a plurality of first via holes 321 are provided to ensure the reliability of the connection between the detection wires 211 and the conductive wires 212. Of course, each conductive wire 212 may also be exposed through three or more first via holes 321, and each conductive wire 212 may be exposed through the same number of first via holes 321, or may be exposed through a different number of first via holes 321.

In an embodiment of the present disclosure, each conductive wire 212 is exposed through a plurality of second via holes 322. As shown in FIG. 8, each conductive wire 212 is exposed through the four second via holes 322 to ensure the reliability of bonding. Of course, each conductive wire 212 may also be exposed through five or more second via holes 322, and each conductive wire 212 may be exposed through the same number of second via holes 322, or may be exposed through a different number of second via holes 322.

In an embodiment of the present disclosure, the detection wire 211 located on the controllable on-off region B has an oxidation part, the detection wire 211 is processed by metal oxidation to form an oxidized part with poor conductivity or insulation, so that the detection wire 211 is in a disconnected state and cannot conduct normally. Therefore, it can be ensured that the AT trace at the edge cannot be connected to the inside of the array substrate, thereby reducing the probability of occurrence of defects caused by static electricity produced by personnel picking and placing operations on the array substrate after manufacturing process.

Figure 11:
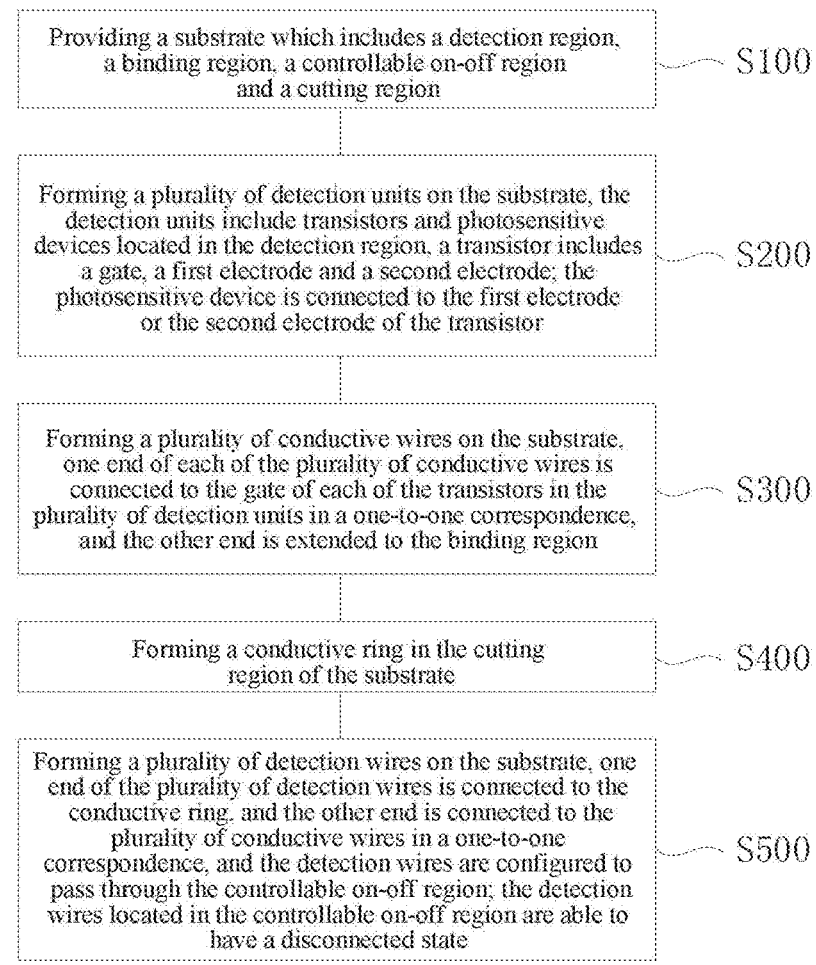
FIG. 11 is a flowchart of a manufacturing method of a detection substrate of an embodiment of the present disclosure.

The embodiments of the present disclosure also provide a manufacturing method of the detection substrate. As shown in FIG. 11, the manufacturing method includes:

Step S100, providing a substrate, which includes a detection region, a binding region, a controllable on-off region and a cutting region;

Step S200, forming a plurality of detection units on the substrate, the detection units include transistors and photosensitive devices located in the detection region, the transistor includes a gate, a first electrode and a second electrode; the photosensitive device is connected to the first electrode or the second electrode of the transistor;

Step S300, forming a plurality of conductive wires on the substrate, one end of each of the plurality of conductive wires is connected to the gate of each of the transistors in the plurality of detection units in a one-to-one correspondence, and the other end extends to the binding region;

Step S400, forming a conductive ring on the cutting region of the substrate;

Step S500, forming a plurality of detection wires on the substrate, one end of the plurality of detection wires is connected to the conductive ring, and the other end is connected to the plurality of conductive wires in a one-to-one correspondence, and the detection wires are configured to pass through the controllable on-off region; where, the detection wires located in the controllable on-off region can have a disconnected state.

In the manufacturing method of the detection substrate provided by the present disclosure, the detection wires on the controllable on-off region can have a disconnected state, at the end of the manufacturing process, the AT trace is removed to ensure that the AT trace at the edge cannot be connected to the inside of the array substrate in the back-end process, thereby reducing the probability of occurrence of defects caused by static electricity produced by personnel picking and placing operations on the array substrate after the manufacturing process.

Hereinafter, each step in the manufacturing method of the detection substrate provided by the present disclosure will be described in detail.

In the Step S100, providing a substrate, which includes a detection region, a binding region, a controllable on-off region and a cutting region.

Specifically, as shown in FIG. 1, the material of the substrate 10 may be an inorganic material, such as soda lime glass, quartz glass, sapphire glass and other glass materials, or metal materials of various metals such as stainless steel, aluminum, and nickel or alloys thereof. In other embodiments, the material of the substrate 10 may also be an organic material, such as polymethylmethacrylate (PMMA), polyvinyl alcohol (PVA), polyvinylphenol (PVP), polyethersulfone (PES), polyimide, polyamide, polyacetal, polycarbonate (PC), polyethylene terephthalate (PET), polyethylene naphthalate (PEN), or a combination thereof. In other embodiments, the material of the substrate 10 may also be a flexible material, such as polyimide (PI). The substrate 10 may be a single-layer structure or a multi-layer structure, and the multi-layer structure may be formed of different materials.

In the Step S200, forming a plurality of detection units on the substrate, the detection units include transistors and photosensitive devices located in the detection region, the transistor includes a gate, a first electrode and a second electrode; the photosensitive device is connected to the first electrode or the second electrode of the transistor.

Specifically, as shown in FIG. 1, the gate 21, the gate insulating layer 22, the active layer 23, the first electrode 24, and the second electrode 25 of the thin film transistor are sequentially formed on the substrate 10 through a patterning process. Firstly, a gate metal film layer is formed on the substrate 10 by using a sputtering method, a thermal evaporation method, a plasma enhanced chemical vapor deposition method, a low pressure chemical vapor deposition method, an atmospheric pressure chemical vapor deposition method or an electron cyclotron resonance chemical vapor deposition method. Then a pattern of the gate is formed by using a half tone mask (HTM) or a gray tone mask (GTM) through a patterning process (film formation, exposure, development, wet etching or dry etching). Where, the gate can be made of metal or metal alloy, such as molybdenum, molybdenum niobium alloy, aluminum, aluminum neodymium alloy, titanium, or copper or other conductive materials; then a gate insulating layer 22 covering the gate 21 is formed on the substrate 10 by using a plasma enhanced chemical vapor deposition method, a low pressure chemical vapor deposition method, an atmospheric pressure chemical vapor deposition method, an electron cyclotron resonance chemical vapor deposition method, or a sputtering method; then an amorphous silicon film is deposited by plasma enhanced chemical vapor deposition, low pressure chemical vapor deposition, etc., and the pattern of the active layer 23 is formed through a patterning process after crystallizing the amorphous silicon film; next, the source-drain metal layers are formed by the plasma enhanced chemical vapor deposition method, the low pressure chemical vapor deposition method, the atmospheric pressure chemical vapor deposition method, the electron cyclotron resonance chemical vapor deposition method, or the sputtering method, and a pattern including the first electrode 24 and the second electrode 25 is simultaneously formed through one patterning process. Where, the first electrode 24 is a source electrode and the second electrode 25 is a drain electrode; or the first electrode 24 is a drain electrode and the second electrode 25 is a source electrode.

Next, the first passivation layer 31 is formed by a patterning process, and a via hole is formed on the first passivation layer 31 at a position corresponding to the second electrode 25. Exemplary, the first passivation layer 31 may be deposited by the plasma enhanced chemical vapor deposition method, the low pressure chemical vapor deposition method, the atmospheric pressure chemical vapor deposition method, or the electron cyclotron resonance chemical vapor deposition method, and the via hole may be formed through patterning processes such as masking and dry etching. Where, the material of the first passivation layer 31 may include materials such as silicon nitride and silicon oxide.

Then, a pattern including the lower electrode 41 of the photodiode is formed by a patterning process, and it is connected to the second electrode 25 of the thin film transistor through the via hole. Similar to the process for forming the first electrode 24 and the second electrode 25 of the thin film transistor, in this step, a metal film layer may be deposited on the first passivation layer 31 by the plasma enhanced chemical vapor deposition method, the low pressure chemical vapor deposition method, the atmospheric pressure chemical vapor deposition method, the electron cyclotron resonance chemical vapor deposition method or the sputtering method, and the pattern of the lower electrode 41 of the photodiode may be formed through patterning processes such as masking and wet etching. Where, the metal film layer can be made of metal or metal alloy, such as molybdenum, molybdenum niobium alloy, aluminum, aluminum neodymium alloy, titanium, or copper or other conductive materials.

Then, as shown in FIG. 1, a photovoltaic layer 42 is deposited on the lower electrode 41. The steps of forming the photoelectric layer 42 include: depositing an etching barrier material layer by the sputtering method, the thermal evaporation or plasma enhanced chemical vapor deposition method, the low pressure chemical vapor deposition method, the atmospheric pressure chemical vapor deposition method, or the electron cyclotron resonance chemical vapor deposition method; depositing a semiconductor material layer on the top of the etching barrier material layer by the plasma enhanced chemical vapor deposition and low pressure chemical vapor deposition method; removing the semiconductor material layer outside the photodiode region to form the photoelectric layer through the plasma etching (PE), reactive ion etching (RIE), enhanced capacitive coupled plasma etching (ECCP) and inductively coupled plasma etching (ICP) and other dry etching processes.

Where, in order to make the photoelectric layer 42 of the photodiode have good ohmic contact with the upper electrode 44 of the photodiode to be formed, after the photoelectric layer 42 is formed, a transparent conductive layer 43 may be formed on the photoelectric layer 42; after that, the transparent conductive layer 43 is etched first to form a transparent electrode. The material of the transparent electrode can be ITO, IGZO, etc.

As shown in FIG. 1, a planarization layer is formed on the substrate 10 on which the first passivation layer 31 and the photoelectric layer 42 of the photodiode are formed, a second passivation layer 32 is formed on the side of the planarization layer away from the substrate 10, and via holes are formed in the second passivation layer 32 and the planarization layer at positions corresponding to the photoelectric layer 42.

Where, the material of the second passivation layer 32 may include silicon nitride and silicon oxide layer materials; the material of the planarization layer includes resin, and the thickness of the planarization layer is relatively large, so as to flatten the substrate 10 of the flat panel detector. The interlayer insulating material film can be deposited through the plasma-enhanced chemical vapor deposition method, the low-pressure chemical vapor deposition method, the atmospheric pressure chemical vapor deposition method, or the electron cyclotron resonance chemical vapor deposition method, and via holes are formed at a position corresponding to the photoelectric layer 42 through patterning processes such as masking and etching.

In an embodiment of the present disclosure, because the planarization layer with a single layer of resin material has a large thickness, it is easy to fall off, in order to further ensure the performance of the product, the planarization layer preferably includes a first planarization layer 51 and a second planarization layer 52 arranged in sequence. The material of the first planarization layer 51 may include silicon nitride and silicon oxide layer materials, and the material of the second planarization layer 52 includes resin. And as shown in FIG. 1, the thickness of the second planarization layer 52 is greater than the thickness of the first planarization layer 51.

As shown in FIG. 8, a pattern including the upper electrode 44 of the photodiode is formed by a patterning process, and the upper electrode 44 of the photodiode is connected to the photoelectric layer 42 through a via hole. Specifically, a metal film layer may be deposited on the second passivation layer 32 by the plasma enhanced chemical vapor deposition method, the low pressure chemical vapor deposition method, the atmospheric pressure chemical vapor deposition method, the electron cyclotron resonance chemical vapor deposition method or the sputtering method, and the pattern of the upper electrode 44 (bias electrode) of the photodiode may be formed through patterning processes such as masking and wet etching. The material of the metal film layer may be metal or metal alloy, such as molybdenum, molybdenum niobium alloy, aluminum, aluminum neodymium alloy, titanium, or copper or other conductive materials.

The lower electrode 41, the photoelectric layer 42, and the upper electrode 44 arranged in sequence on the substrate 10 constitute a photodiode. The lower electrode 41 of the photodiode is connected to the second electrode 25 of the thin film transistor to realize the connection between the photodiode and the thin film transistor, so that the detection of the collected optical signal of the photodiode is realized by controlling the conduction state of the thin film transistor.

It should be noted here that the lower electrode 41 of the photodiode in this embodiment may be directly connected to the second electrode 25 of the thin film transistor, or may be indirectly connected through a conductive layer.

In step S300, forming a plurality of conductive wires on the substrate, one end of each of the plurality of conductive wires is connected to the gate of each of the transistors in the plurality of detection units in a one-to-one correspondence, and the other end extends to the binding region.

Specifically, a gate metal film layer is formed on the substrate 10 through the sputtering method, the thermal evaporation method, the plasma enhanced chemical vapor deposition method, the low pressure chemical vapor deposition method, the atmospheric pressure chemical vapor deposition method or the electron cyclotron resonance chemical vapor deposition method; then, a halftone mask or a gray tone mask is used to form the pattern of the gate 21 through the patterning process (film formation, exposure, development, wet etching or dry etching), and at the same time, a plurality of conductive wires 212 connected to the gates 21 of the transistors in the plurality of detection units in a one-to-one correspondence can be formed through the same one patterning process, the plurality of conductive wires 212 extend to the binding region C.

In the step S400, forming a conductive ring on the cutting region of the substrate.

Specifically, as shown in FIG. 2, the gate metal film layer is formed on the substrate 10 through the sputtering method, the thermal evaporation method, the plasma enhanced chemical vapor deposition method, the low pressure chemical vapor deposition method, the atmospheric pressure chemical vapor deposition method or the electron cyclotron resonance chemical vapor deposition method; then a halftone mask or a gray tone mask is used to form the conductive ring 210 through the patterning process (film formation, exposure, development, wet etching or dry etching)

In the step S500, forming a plurality of detection wires on the substrate, one end of the plurality of detection wires is connected to the conductive ring, and the other end is connected to the plurality of conductive wires in a one-to-one correspondence, and the detection wires are configured to pass through the controllable on-off region; where, the detection wires located on the controllable on-off region can have a disconnected state.

Specifically, the conductive ring 210 and the plurality of detection wires 211 can be formed by one patterning process. As shown in FIG. 2, the controllable on-off region B is located between the binding region C and the cutting region A, one end of the plurality of detection wires 211 is connected to the conductive ring 210, and the other end is connected to the plurality of conductive wires 212 in a one-to-one correspondence, and the detection wires 211 are configured to pass through the controllable on-off region B.

In an embodiment of the present disclosure, cutting openings 33 are formed on the detection wires 211 located in the controllable on-off region B, and the detection wires 211 are in a disconnected state through the cutting openings 33.

Specifically, the substrate 10 is formed with a wiring layer, a gate insulating layer 22, a first passivation layer 31 and a second passivation layer 32 in the controllable on-off region B, a patterned mask layer (photoresist layer 70) is formed on the second passivation layer 32, and the patterned mask layer exposes the portion of the second passivation layer 32 corresponding to the controllable on-off region B. An etching hole penetrating the second passivation layer 32, the first passivation layer 31, the gate insulating layer 22 and the wiring layer is formed in the controllable on-off region B through dry etching processes such as the plasma etching (PE), the reactive ion etching (RIE), the enhanced capacitive coupled plasma etching (ECCP), the inductively coupled plasma etching (ICP), or through etching processes such as spraying and dipping. The etching hole cuts off a plurality of detection wires 211, so that a cutting opening 33 is formed on the detection wire 211. The method for forming the cutting openings 33 is not limited to this, and the cutting openings 33 can also be formed on the detection wires 211 by grinding, cutting, or the like. By forming the cutting openings 33, it is ensured that the AT trace at the edge cannot be connected to the inside of the array substrate in the back-end process, thereby reducing the probability of occurrence of defects caused by static electricity produced by personnel picking and placing operations on the array substrate after manufacturing process.

In an embodiment of the present disclosure, a tip discharge portion 2111 is formed on the detection wire 211 located in the controllable on-off region B, and the detection wire 211 is disconnected by the tip discharge portion 2111. Specifically, as shown in FIG. 7, the controllable on-off region B is located between the binding region C and the cutting region A; the plurality of conductive wires 212 are configured to extend to the controllable on-off region B; an insulating layer 90 is formed on the side of the plurality of conductive wires 212 away from the substrate 10; a plurality of first via holes 321 and a plurality of second via holes 322 are formed in the insulating layer 90, the orthographic projections of the first via holes 321 on the substrate 10 are located in the controllable on-off region B, and the orthographic projections of the second via holes 322 on the substrate 10 are located in the binding region C, so that each conductive wire 212 is simultaneously exposed through the first via holes 321 and the second via holes 322; the area of the orthographic projection of the first via hole 321 on the substrate 10 is smaller than the area of the orthographic projection of the second via hole 322 on the substrate 10; a plurality of detection wires 211 are formed on the side of the insulating layer 90 away from the substrate 10, and the plurality of detection wires 211 are connected to the plurality of conductive wires 212 in a one-to-one correspondence through the first via holes 321. Where, the first via holes 321 and the second via holes 322 may be formed on the insulating layer 90 through patterning processes such as masking and etching. The detection wire 211 forms a tip discharge portion 2111 in the first via hole 321 (for example, a tip discharge portion 2111 may be formed at a portion where the first via hole 321 is projected on the substrate 10 with the smallest area).

In the manufacturing process, the AT trace is used to dissipate static electricity, and the voltage actually distributed to a single trace is relatively small, which can be conducted through lapping small-size ITO over via holes; after the manufacturing process, when static electricity is introduced by the AT trace, the small-size ITO lapped over via holes cannot conduct excessive voltage and burn out, the static conduction path is cut off and cannot be further conducted into the FTXD to damage the devices and traces. In the present disclosure, by designing different regions to use different sizes of via holes for lapping, it can not only ensured that there are AT traces to connect the traces in most of the manufacturing processes, further achieve ESD protection throughout the manufacturing process and reduce ESD damage to a single device during the manufacturing process, but also ensure that the AT traces at the edge cannot be connected to the inside of the array substrate in the back-end process, in the case that large voltage is introduced due to personnel touch after the manufacturing process, the via holes for lapping are easily burnout, thereby reducing the probability of occurrence of defects caused by static electricity produced by personnel picking and placing operations on the array substrate after manufacturing process, and further avoiding the introduction of static electricity into the FTXD product, which plays a role in protecting the device.

In an embodiment of the present disclosure, the detection wires 211 located on the controllable on-off region (B) can be metal oxidized to form an oxide portion with poor conductivity or insulation, so that the detection wires 211 are in a disconnected state and cannot conduct normally. Therefore, it can be ensured that the AT trace at the edge cannot be connected to the inside of the array substrate, thereby reducing the probability of occurrence of defects caused by static electricity produced by personnel picking and placing operations on the array substrate after manufacturing process.

In an embodiment of the present disclosure, the manufacturing method further includes: forming a first conductive portion 81 on the side of the insulating layer 90 away from the substrate 10, and the plurality of first conductive portions 81 form a plurality of detection wires 211. Specifically, forming a gate metal film layer on the insulating layer 90 through the sputtering method, the thermal evaporation method, the plasma enhanced chemical vapor deposition method, the low pressure chemical vapor deposition method, the atmospheric pressure chemical vapor deposition method or the electron cyclotron resonance chemical vapor deposition method; then, forming a pattern of the first conductive portion 81 by using the halftone mask or a gray tone mask through the patterning process. Where, the insulating layer 90 and the gate insulating layer 22 are formed by one patterning process.

In an embodiment of the present disclosure, the manufacturing method further includes: forming a plurality of second conductive portions 82 on the side of the insulating layer 90 away from the substrate 10, and the plurality of second conductive portions 82 and the plurality of conductive wires 212 are connected in a one-to-one correspondence through the second via holes 322. Specifically, forming a gate metal film layer on the insulating layer 90 through the sputtering method, the thermal evaporation method, the plasma enhanced chemical vapor deposition method, the low pressure chemical vapor deposition method, the atmospheric pressure chemical vapor deposition method or the electron cyclotron resonance chemical vapor deposition method; then, forming a pattern of the second conductive portion 82 by using the halftone mask or a gray tone mask through the patterning process.

Where, the first conductive portions 81 and the second conductive portion 82 are formed by one patterning process, that is, the both can be disposed on the same layer.

For other details that are not disclosed by the manufacturing method of the detection substrate provided by the embodiment of the present disclosure, please refer to the relevant description of the detection substrate embodiments above, which will not be repeated here.

The embodiments of the present disclosure also provides a manufacturing method of a flat panel detector, which includes: the manufacturing method of the detection substrate provided by the embodiments described above; removing the cutting region A on the detection substrate, and the cutting region on the detection substrate can be cut and removed along the dashed line at the junction of the cutting region A and the controllable on-off region B.

In an embodiment of the present disclosure, the manufacturing method of the flat panel detector may further include forming a scintillation layer on the substrate provided with a plurality of detection units, the scintillation layer is used to convert X-rays into visible light, the photosensitive device is used to convert the visible light into electrical signals, and the transistor is used as a switch to read the electrical signals.

Where, the material of the scintillation layer may include Cesium iodide, which is a light-sensitive material. The scintillation layer may include a columnar array of crystals. Alternatively, a passivation layer may be provided between the scintillation layer and the photosensitive device, and the passivation layer may be used to protect the photosensitive device.

It should be noted that although the various steps of the method in the present disclosure are described in a specific order in the accompanying drawings, but this does not require or imply that these steps must be performed in the specific order, or that all the steps shown must be performed to achieve the desired result. Additionally or alternatively, some steps may be omitted, multiple steps may be combined into one step for execution, and/or one step may be divided into multiple steps for execution, etc.

The embodiments of the present disclosure also provide a flat panel detector, which can be formed by the above-mentioned manufacturing method of the flat panel detector. The flat panel detector can be an X-ray flat panel detector. For its beneficial effects, refer to the foregoing description of the beneficial effects of the detection substrate and its manufacturing method, which will not be repeated here.

It should be noted that the "on", "formed on" and "disposed on" in this specification can mean that one layer is directly formed or disposed on another layer, or it can mean a layer is indirectly formed or disposed on another layer, that is, there are other layers between the two layers.

The terms "one", "a", "the", "said" and "at least one" are used to indicate that there are one or more elements/components/etc.; the terms "comprise/include" and "have" are used to mean open-ended inclusion and mean that in addition to the listed elements/components/etc., there may be other elements/components/etc.

It should be noted that although the terms "first", "second", etc. may be used herein to describe various regions, layers and/or parts, these regions, layers and/or parts should not be limited by these terms. Rather, these terms are used to distinguish one region, layer, and/or part from another.

In the present disclosure, unless otherwise specified, the term "same layer arrangement" is used to mean that two layers, parts, components, elements or portions can be formed by the same patterning process, and the two layers, parts, components, elements or portions are generally formed of the same material.

In the present disclosure, unless otherwise specified, the expression "patterning process" generally includes the steps of photoresist coating, exposure, development, etching, and photoresist stripping, etc. The expression "one patterning process" means a process of forming patterned layers, parts, components, etc., using one mask.

After considering the specification and practicing the disclosure herein, it will be easy for those skilled in the art to think of the other implementations of the disclosure. The present disclosure intends to cover any variants, usage or changes of adaptation of the present disclosure. These variants, usage or changes of adaptation follow the general principles of the present disclosure, and include common sense or common technical means in the technical field not disclosed by the disclosure. The specification and embodiments are only exemplary.

What is claimed is:

1. A detection substrate, comprising:
   a substrate, comprising a detection region, a binding region, a controllable on-off region, and a cutting region;
   a plurality of detection units, disposed on the substrate, wherein the detection units comprise transistors and photosensitive devices located in the detection region, a transistor comprises a gate, a first electrode and a second electrode; a photosensitive device is connected to the first electrode or the second electrode of the transistor;
   a plurality of conductive wires, disposed on the substrate, wherein one end of the plurality of conductive wires is connected to the gate of each of the transistors of the plurality of detection units in a one-to-one correspondence, and the other end is configured to extend to the binding region;
   a conductive ring, disposed in the cutting region of the substrate;
   a plurality of detection wires, disposed on the substrate, wherein one end thereof is connected to the conductive ring, and the other end is connected to the plurality of conductive wires in a one-to-one correspondence, and the detection wires are configured to pass through the controllable on-off region;
   wherein the detection wires located in the controllable on-off region is able to have a disconnected state.

2. The detection substrate according to claim 1, wherein the detection wires located in the controllable on-off region are provided with cutting openings, and the cutting openings make the detection wires in the disconnected state.

3. The detection substrate according to claim 2, wherein the controllable on-off region is located between the binding region and the cutting region; an etching hole is formed on the controllable on-off region, and the etching hole is cut off the plurality of detection wires, so that the cutting openings are formed on the detection wires.

4. The detection substrate according to claim 3, wherein the detection units comprise the following layers which are formed in the controllable on-off region:
   a wiring layer which comprises the plurality of detection wires;
   a gate insulating layer which is disposed on a side of the wiring layer away from the substrate;
   a first passivation layer which is disposed on a side of the gate insulating layer away from the substrate;
   a second passivation layer which is disposed on a side of the first passivation layer away from the substrate;
   wherein the etching hole formed in the controllable on-off region is configured to penetrate the second passivation layer, the first passivation layer, the gate insulating layer and the wiring layer.

5. The detection substrate according to claim 2, wherein the plurality of conductive wires and the plurality of detection wires are disposed in a same layer.

6. The detection substrate according to claim 1, wherein the detection wires located in the controllable on-off region is provided with tip discharge portions, and the tip discharge portions are able to be fused by a tip discharge to make the detection wires in the disconnected state.

7. The detection substrate according to claim 6, wherein the controllable on-off region is located between the binding region and the cutting region; the plurality of conductive wires are extended to the controllable on-off region, a side of the plurality of conductive wires away from the substrate is formed with an insulating layer, and the plurality of detection wires are formed on a side of the insulating layer away from the substrate;
   wherein a plurality of first via holes and a plurality of second via holes are formed on the insulating layer, orthographic projections of the first via holes on the substrate are located in the controllable on-off region, and orthographic projections of the second via holes on the substrate are located in the binding region; each of the conductive wires is simultaneously exposed through the first via holes and the second via holes; an area of the orthographic projections of the first via holes on the substrate is smaller than an area of the orthographic projections of the second via holes on the substrate; the plurality of detection wires are connected to the plurality of conductive wires in a one-to-one correspondence through the first via holes; the detection wires are configured to form the tip discharge portions in the first via holes.

8. The detection substrate according to claim 7, wherein a width of a first via hole is in a range of 1 μm-2 μm.

9. The detection substrate according to claim 7, wherein a depth of a first via hole is in a range of 0.2 μm-1 μm.

10. The detection substrate according to claim 7, wherein an angle between a sidewall of a first via hole and the substrate is less than 90°.

11. The detection substrate according to claim 7, wherein a plurality of first conductive portions are formed on a side of the insulating layer away from the substrate, and the plurality of first conductive portions are connected to the conductive wires in a one-to-one correspondence through the first via holes, the plurality of first conductive portions are formed the plurality of detection wires.

12. The detection substrate according to claim 11, wherein a plurality of second conductive portions are formed on the side of the insulating layer away from the substrate, and the plurality of second conductive portions are connected to the conductive wires in a one-to-one correspondence through the second via holes.

13. The detection substrate according to claim 12, wherein the plurality of first conductive portions and the plurality of second conductive portions are disposed in a same layer.

14. The detection substrate according to claim 7, wherein each of the conductive wires is exposed through the plurality of the first via holes.

15. A manufacturing method of a detection substrate, comprising:
- providing a substrate, comprising a detection region, a binding region, a controllable on-off region and a cutting region;
- forming a plurality of detection units on the substrate, wherein the detection units comprise transistors and photosensitive devices located in the detection region, a transistor comprises a gate, a first electrode and a second electrode; the photosensitive device is connected to the first electrode or the second electrode of the transistor;
- forming a plurality of conductive wires on the substrate, one end of each of the plurality of conductive wires is connected to the gate of each of the transistors in the plurality of detection units in a one-to-one correspondence, and the other end is extended to the binding region;
- forming a conductive ring in the cutting region of the substrate;
- forming a plurality of detection wires on the substrate, wherein one end of the plurality of detection wires is connected to the conductive ring, and the other end is connected to the plurality of conductive wires in a one-to-one correspondence, and the detection wires are configured to pass through the controllable on-off region; the detection wires located in the controllable on-off region are able to have a disconnected state.

16. The manufacturing method according to claim 15, wherein cutting openings are formed on the detection wires located in the controllable on-off region, and the detection wires are in a disconnected state through the cutting openings.

17. The manufacturing method according to claim 15, wherein tip discharge portions are formed on the detection wires located in the controllable on-off region, and the detection wires are disconnected by the tip discharge portions.

18. A manufacturing method of a flat panel detector, comprising:
a manufacturing method of a detection substrate, comprising:
- providing a substrate, comprising a detection region, a binding region, a controllable on-off region and a cutting region;
- forming a plurality of detection units on the substrate, wherein the detection units comprise transistors and photosensitive devices located in the detection region, a transistor comprises a gate, a first electrode and a second electrode; the photosensitive device is connected to the first electrode or the second electrode of the transistor;
- forming a plurality of conductive wires on the substrate, one end of each of the plurality of conductive wires is connected to the gate of each of the transistors in the plurality of detection units in a one-to-one correspondence, and the other end is extended to the binding region;
- forming a conductive ring in the cutting region of the substrate;
- forming a plurality of detection wires on the substrate, wherein one end of the plurality of detection wires is connected to the conductive ring, and the other end is connected to the plurality of conductive wires in a one-to-one correspondence, and the detection wires are configured to pass through the controllable on-off region; the detection wires located in the controllable on-off region are able to have a disconnected state; and
removing a cutting region on the detection substrate.

19. A flat panel detector, which is formed by the manufacturing method of a flat panel detector of claim 18.

20. The manufacturing method according to claim 18, wherein cutting openings are formed on the detection wires located in the controllable on-off region, and the detection wires are in a disconnected state through the cutting openings.

* * * * *